United States Patent
Denk

(10) Patent No.: US 10,634,106 B2
(45) Date of Patent: Apr. 28, 2020

(54) PRECISE DETERMINATION OF THE ELECTRICAL RESISTANCE OF A FUEL INJECTOR HAVING A SOLENOID DRIVE

(71) Applicant: Continental Automotive GmbH, Hannover (DE)

(72) Inventor: Frank Denk, Obertraubling (DE)

(73) Assignee: Vitesco Technologies GmbH, Hannover (DE)

( * ) Notice: Subject to any disclaimer, the term of this patent is extended or adjusted under 35 U.S.C. 154(b) by 107 days.

(21) Appl. No.: 15/738,331

(22) PCT Filed: Apr. 14, 2016

(86) PCT No.: PCT/EP2016/058202
§ 371 (c)(1),
(2) Date: Dec. 20, 2017

(87) PCT Pub. No.: WO2017/001077
PCT Pub. Date: Jan. 5, 2017

(65) Prior Publication Data
US 2018/0180010 A1    Jun. 28, 2018

(30) Foreign Application Priority Data

Jun. 30, 2015  (DE) .................. 10 2015 212 135

(51) Int. Cl.
*F02M 65/00*  (2006.01)
*F02D 41/20*  (2006.01)
(Continued)

(52) U.S. Cl.
CPC ............. *F02M 65/00* (2013.01); *F02D 41/20* (2013.01); *G01K 7/16* (2013.01); *G01R 27/02* (2013.01);
(Continued)

(58) Field of Classification Search
USPC ........................................................ 324/713
See application file for complete search history.

(56) References Cited

U.S. PATENT DOCUMENTS

2015/0267661 A1* 9/2015 Namuduri .......... F02M 51/0689
                                                       239/585.1

FOREIGN PATENT DOCUMENTS

DE       19544207 A1    6/1997
DE    102007053408 A1   5/2009
(Continued)

OTHER PUBLICATIONS

International Search Report and Written Opinion dated Jul. 14, 2016 from corresponding International Patent Application No. PCT/EP2016/058202.
(Continued)

*Primary Examiner* — Jay Patidar

(57) ABSTRACT

The invention relates to a method for determining an electrical resistance value for a fuel injector having a solenoid drive. The method comprises the following: (a) applying a voltage pulse to the solenoid drive of the fuel injector, (b) sensing a temporal progression of the current intensity of a current (I) flowing through the solenoid drive, (c) calculating a series of linked fluxes ($\Psi$) as a function of current intensity (I), wherein each linked flux ($\Psi$) is calculated on the basis of the temporal progression of voltage and current intensity (I) and on the basis of a hypothetical resistance value from a series of hypothetical resistance values, and (d) selecting one of the hypothetical resistance values as a determined resistance value on the basis of an analysis of the calculated series of linked fluxes ($\Psi$). The invention further relates to a method for determining a temperature of a coil of a fuel injector having a solenoid drive, to a motor controller, and to a computer program.

20 Claims, 3 Drawing Sheets

(51) Int. Cl.
*G01K 7/16* (2006.01)
*G01R 27/02* (2006.01)
*F02D 41/14* (2006.01)
*F02M 51/06* (2006.01)

(52) U.S. Cl.
CPC ........... *F02D 2041/1433* (2013.01); *F02D 2041/2058* (2013.01); *F02D 2041/2062* (2013.01); *F02D 2041/2065* (2013.01); *F02M 51/061* (2013.01)

(56) References Cited

FOREIGN PATENT DOCUMENTS

| | | |
|---|---|---|
| DE | 102011075935 A1 | 11/2012 |
| DE | 102012218327 A1 | 4/2014 |
| DE | 102012224416 A1 | 7/2014 |
| WO | 2001/71823 A2 | 9/2001 |

OTHER PUBLICATIONS

Office Action dated Feb. 22, 2016 from corresponding German Patent Application No. 10 2015 212 135.6.

\* cited by examiner

PRECISE DETERMINATION OF THE ELECTRICAL RESISTANCE OF A FUEL INJECTOR HAVING A SOLENOID DRIVE

FIELD OF INVENTION

The present invention relates in general to the technical field of controlling fuel injectors. The present invention relates in particular to a method for determining an electrical resistance value for a fuel injector having a solenoid drive. The present invention relates moreover to a method for determining a temperature of a coil of a fuel injector comprising a solenoid drive. The present invention relates furthermore to an engine control unit and a computer program that are configured so as to perform the method.

BACKGROUND

During the operation of fuel injectors having a solenoid drive (also referred to as coil injectors), the individual injectors have a different temporal opening behavior as a result of electrical and mechanical tolerances and consequently variations in the respective quantity of injected fuel can occur.

The relative differences in the quantity of injected fuel from injector to injector increase as the injection time periods become shorter. These relative differences in quantity were hitherto small and of no practical importance. However, the development in the direction of smaller quantities of injected fuel and shorter time periods have resulted in it no longer being possible to ignore the influence of the relative differences in quantities of injected fuel.

The differences in quantity can be analyzed and corrected inter alia on the basis of knowing the points in time at which the hydraulic opening event occurs. The hydraulic opening phase of a high pressure injection valve is usually realized in an electrical manner by means of a so-called booster phase (in which a voltage that is higher than the battery voltage is applied to the injector (boost voltage)). The hydraulic opening event occurs in this booster phase and the subsequent idling phase. It is possible using the electrical variables: coil current and coil voltage and also the ohmic or electrical coil resistance of the fuel injector, to determine magnetic variables which can be used in different analyzing methods to obtain information relating to the opening behavior and moving behavior of the injector. One of these magnetic variables is the linked magnetic flux $\Psi$ (Psi) that is plotted against the injector current. The accuracy of the characteristic curve and consequently also of the hydraulic opening event is in this case above all determined on the basis of knowing the accuracy of the ohmic resistance.

A precise determination of the electrical coil resistance is however costly and can only be realized using additional hardware, for example for performing a 4-pole measuring procedure or four terminal sensing procedure.

Summary

The object of the present invention is to render possible a simple and precise determination of the electrical coil resistance in a fuel injector having a solenoid drive without having to use additional hardware that increases the cost.

This object is achieved by means of the subject matters of the independent claims. Advantageous embodiments of the present invention are described in the dependent claims.

In accordance with one aspect of the invention, a method is described for determining an electrical resistance value for a fuel injector having a solenoid drive. The described method comprises the following: (a) applying a voltage pulse to the solenoid drive of the fuel injector, (b) ascertaining a temporal progression of the current strength of a current that is flowing through the solenoid drive, (c) calculating a series of linked fluxes as a function of the current strength, wherein each linked flux is calculated based on the temporal progression of the voltage and the current strength and on a hypothetical resistance value from a series of hypothetical resistance values, and (d) selecting one of the hypothetical resistance values as a determined resistance value based on an analysis of the calculated series of linked fluxes.

The described method is based on knowing that a calculation of the linked flux $\Psi$ based on the voltage and the current strength, which arise when a voltage pulse is being applied to the solenoid drive, and on a false resistance value for the coil of the solenoid drive produces a non-physical result. Such non-physical results can be identified in particular when observing the correlation between a linked flux and current strength ($\Psi$/I-characteristic curve diagram).

It is possible to calculate the linked flux $\Psi$ (and consequently also the magnetic behavior of the solenoid drive) by means of the following general equation:

$$\psi(I,t) = \int_0^t (U(t) - R_{coil} \cdot I(t)) dt.$$

In this case, U(t) represents the electrical voltage as a function of time, I(t) represents the electrical current as a function of time and $R_{coil}$ represents the resistance value of the coil.

If a non-linear magnetic current is present, for example a solenoid plunger injector, it follows that the current increases the magnetization or the linked flux behaves in such a manner that it moves towards a maximum saturation value with a constant curvature behavior. Any possible movement effects are to be ignored in the region of the maximum value.

If the coil resistance $R_{coil}$ now differs only slightly from the actual value, the correlation between the current strength and the linked flux in conjunction with the above mentioned application of a voltage pulse can comprise a different, non-physical progression. In particular, it is possible when the resistance value is not precise to observe an increasing rise or an unexpected fall in the calculated linked flux in the proximity of the maximum current strength. Such progressions are physically not possible.

The above described findings are now used in accordance with the invention so as to precisely determine the coil resistance. To be more specific, a voltage pulse is applied to the solenoid drive of the fuel injector and the temporal progression of the current strength of the current that is flowing through the solenoid drive (in other words through the coil) is ascertained. The current strength is preferably ascertained both during the voltage pulse and also at the end of the voltage pulse. Based on the current and the voltage, the linked flux is now calculated as a function of the current strength for a series of (different) hypothetical resistance values. This is achieved with reference to the above mentioned formula. In other words, calculated as follows:

$$\psi_k(I,t) = \int_0^t (U(t) - R_{coil,k} \cdot I(t)) dt, k=0,1,2 \ldots, N-1.$$

The calculations for each value of k are performed for a number of values for the time t and consequently it is possible to calculate a series of functions that represent the correlation between linked flux $\Psi$ and current strength I for each hypothetical resistance value $R_{coil,k}$.

The series of calculated functions (Ψ/I-characteristic curves) is mathematically (in particular numerically) analyzed and the function that comprises a (best-fit) physical progression is selected. As a result, the corresponding hypothetical resistance value is selected as the determined resistance value (in other words the result of the method).

The method in accordance with the invention can be implemented in a simple manner in an engine control unit without the need for additional hardware. In particular, it is possible to influence the solenoid valve having existing circuits and control units so as to control the fuel injector and the already existing measuring devices can be readily used to ascertain the voltage and the current. The calculations and the analysis can be performed by the data processing device of the engine control unit.

Consequently, the resistance value of the solenoid can be determined in a simple and cost-effective manner with a high degree of precision by means of a single control and measuring procedure.

In accordance with an exemplary embodiment of the invention, the procedure of analyzing the calculated series of linked fluxes includes an analysis of a curve behavior for each linked flux as a function of current strengths.

The curve behavior of each individual function is analyzed in particular so as to be able to exclude such functions (and thus hypothetical resistance values) that do not match an expected physical progression. This is for example the case if the linked flux suddenly increases or falls in regions where saturation is to be expected.

In accordance with a further exemplary embodiment of the invention, the curve behavior is analyzed in the region of a maximum current strength.

The fuel injector is controlled (in other words a voltage pulse is applied to said fuel injector) in such a manner that saturation is to occur essentially in the region of the maximum current strength.

By virtue of analyzing the curve behavior in this region, any functions that do not represent a saturation can consequently be excluded as not being physically expedient.

In accordance with a further exemplary embodiment of the invention, the determined resistance value is selected as the hypothetical resistance value for which the curve behavior of the corresponding flux demonstrates the smallest change in the region of the maximum current strength.

In other words, the resistance value is selected that results in a Ψ/I relation that comprises in the region of the maximum current strength a progression that is the closest to an asymptotic progression.

In accordance with a further exemplary embodiment of the invention, the procedure of analyzing the curve behavior includes calculating and evaluating a first and/or second derivative of each flux as a function of the current strength.

In so doing, it is possible in particular to exclude the functions in which the absolute value of the second derivative in the region of the maximum current strength is large. Furthermore, it is possible to exclude the functions in which the first derivative in the region of the maximum current strength comprises a negative value.

In accordance with a further exemplary embodiment of the invention, a voltage pulse is applied to the solenoid drive of the fuel injector by means of switching on and off a vehicle battery voltage.

Consequently, it is possible to influence the fuel injector in a simple manner.

The hypothetical resistance values of the series of hypothetical resistance values are predetermined resistance values, each of which the fuel injector, in theory and/or calculation, may potentially possess. In accordance with a further exemplary embodiment of the invention, the series of hypothetical resistance values has a predetermined step size between the individual hypothetical resistance values.

The step size could be in particular in the range between 1 mOhm and 50 mOhm, in particular in the range between 2 mOhm and 40 mOhm, in particular in the range between 3 mOhm and 25 mOhm, in particular in the range between 5 mOhm and 15 mOhm, in particular around 10 mOhm.

When the step size is 10 mOhm, the series of hypothetical resistance values is for example:

$$R_{coil,k} = R_{coil,0} + k*10 \text{ mOhm}.$$

In accordance with a second aspect of the invention, a method is described for determining a temperature of a coil of a fuel injector comprising a solenoid drive. The described method comprises the following: (a) determining a first resistance value for the coil based on a known reference temperature, (b) determining a second resistance value for the coil by using a method in accordance with the first aspect or one of the above mentioned exemplary embodiments, and (c) calculating the temperature based on the determined second resistance value, the determined first resistance value and the known reference temperature.

The method in accordance with this second aspect of the invention uses a first resistance value that is determined based on a known reference temperature (such as for example 0° C. or 20° C.) (for example in the laboratory by means of a four terminal sensing method), and a second resistance value that is determined during operation by means of the method in accordance with the first aspect when the temperature is not known so as to calculate the unknown temperature. For this purpose, only the temperature coefficient of the coil material is required.

Consequently, the temperature of the coil can be determined at any time in accordance with the first aspect on the basis of determining a resistance value.

In accordance with a third aspect of the invention, an engine control unit for a vehicle is described, wherein said engine control unit is configured so as to use a method in accordance with the first and/or second aspect and/or one of the above exemplary embodiments.

This engine control unit renders it possible in a simple manner and without the need for special additional hardware to determine the electrical resistance of an injector coil in a precise manner and to use the determined value in different methods, for example for detecting whether the fuel injector is open or closed.

In accordance with a fourth aspect of the invention, a computer program is described that is configured so as, when said computer program is executed by a processor, to perform the method in accordance with the first and/or the second aspect and/or one of the above exemplary embodiments.

In terms of this document, the naming of such a computer program is synonymous with the concept of a program element, a computer program product and/or a computer-readable medium, which includes instructions for controlling a computer system so as to co-ordinate the operational steps of a system or of a method in a suitable manner in order to achieve the effects associated with the method in accordance with the invention.

The computer program can be executed as a computer-readable instruction code in any suitable program language such as by way of example in JAVA, C++ etc. The computer program can be stored on a computer-readable storage medium (CD-Rom, DVD, Blu-ray Disk, removable drive, volatile or non-volatile storage devices, installed storage devices/processors etc.). The instruction code can program a computer or other programmable devices such as in particular a control unit for an engine of a motor vehicle in such a manner that the desired functions are performed. Moreover, the computer program can be provided in a network, such as by way of example the Internet, from where it can be downloaded by a user as required.

The invention can be achieved both by means of a computer program, i.e. software, and also by means of one or multiple special electrical circuits, i.e. in hardware or in any hybrid form, i.e. by means of software components and hardware components.

Reference is made to the fact that embodiments of the invention are described with reference to different subject matters of the invention. In particular, some embodiments of the invention are described with method claims and other embodiments of the invention are described with device claims. However, the person skilled in the art will immediately see from the doctrine of this application that, insofar as not explicitly otherwise mentioned, in addition to a combination of features that belong to one type of subject matter of the invention, it is also possible to have any combination of features that belong to different types of subject matter of the invention.

BRIEF DESCRIPTION OF THE DRAWINGS

Further advantages and features of the present invention are disclosed in the following exemplary description of a preferred embodiment.

DETAILED DESCRIPTION

Reference is made to the fact that the embodiment described hereinunder is merely a limited selection of possible embodiment variants of the invention.

Figure 1:
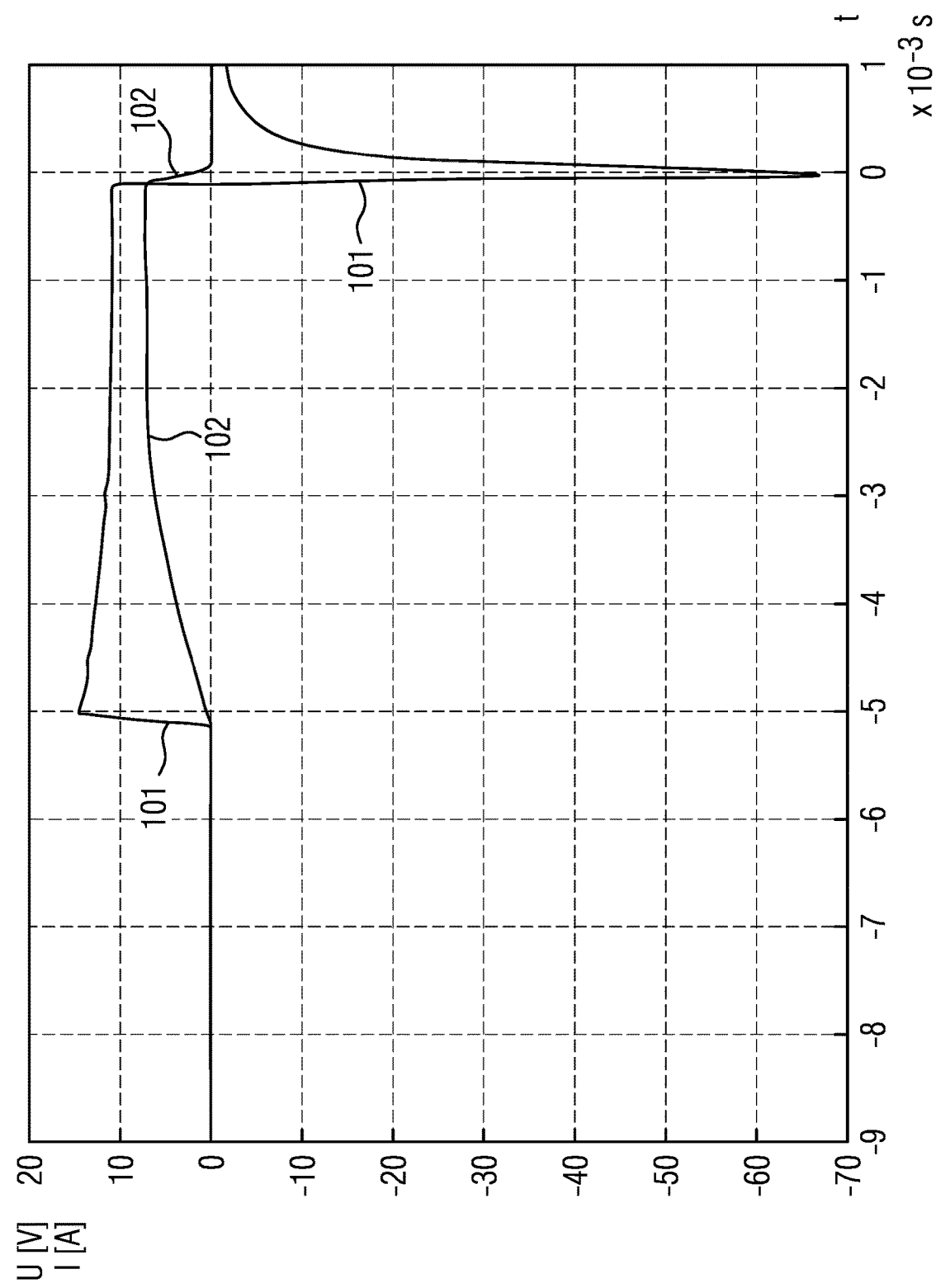
FIG. 1 illustrates the temporal progressions of the voltage and the current strength when determining an electrical resistance value in accordance with an exemplary embodiment.

FIG. 1 illustrates the temporal progression of the voltage 101 and the temporal progression of the current strength 102 when the method is being performed in accordance with the invention for determining an electrical resistance value for a fuel injector having a solenoid drive. At the point in time t=−5 ms, a voltage of approximately 12V (battery voltage in the vehicle) is applied to the fuel injector whose electrical resistance value is to be measured. The voltage is switched off at the point in time t=0 ms so that a voltage pulse is applied to the solenoid drive of the fuel injector for a duration of 5 ms. While the voltage 101 is being applied, a current flows through the solenoid drive whose current strength 102 initially increases relatively quickly (until about a point in time t=−3 ms) and subsequently approaches an asymptotic value of approximately 7.3 A relatively slowly. At the end of the voltage pulse, the current strength 102 drops back rapidly to 0 A.

In order to determine the electrical resistance value for the fuel injector, the temporal progressions 101 and 102 are ascertained and stored in digital format.

A series of calculations is subsequently performed, wherein each calculation corresponds to a hypothetical resistance value from a series of hypothetical resistance values. To be more specific, the linked magnetic flux $\Psi_k$ is calculated for each hypothetical resistance $R_{coil,k}$ and based on the ascertained temporal progressions of the voltage 101 and current strength 102:

$$\psi_k(I,t)=\int_0^t(U(t)-R_{coil,k}\cdot I(t))dt, k=0,1,2,\ldots,N-1.$$

Each calculated linked flux $\Psi_k$ is stored together with the current strength I as a characteristic curve diagram or function.

Figure 2:
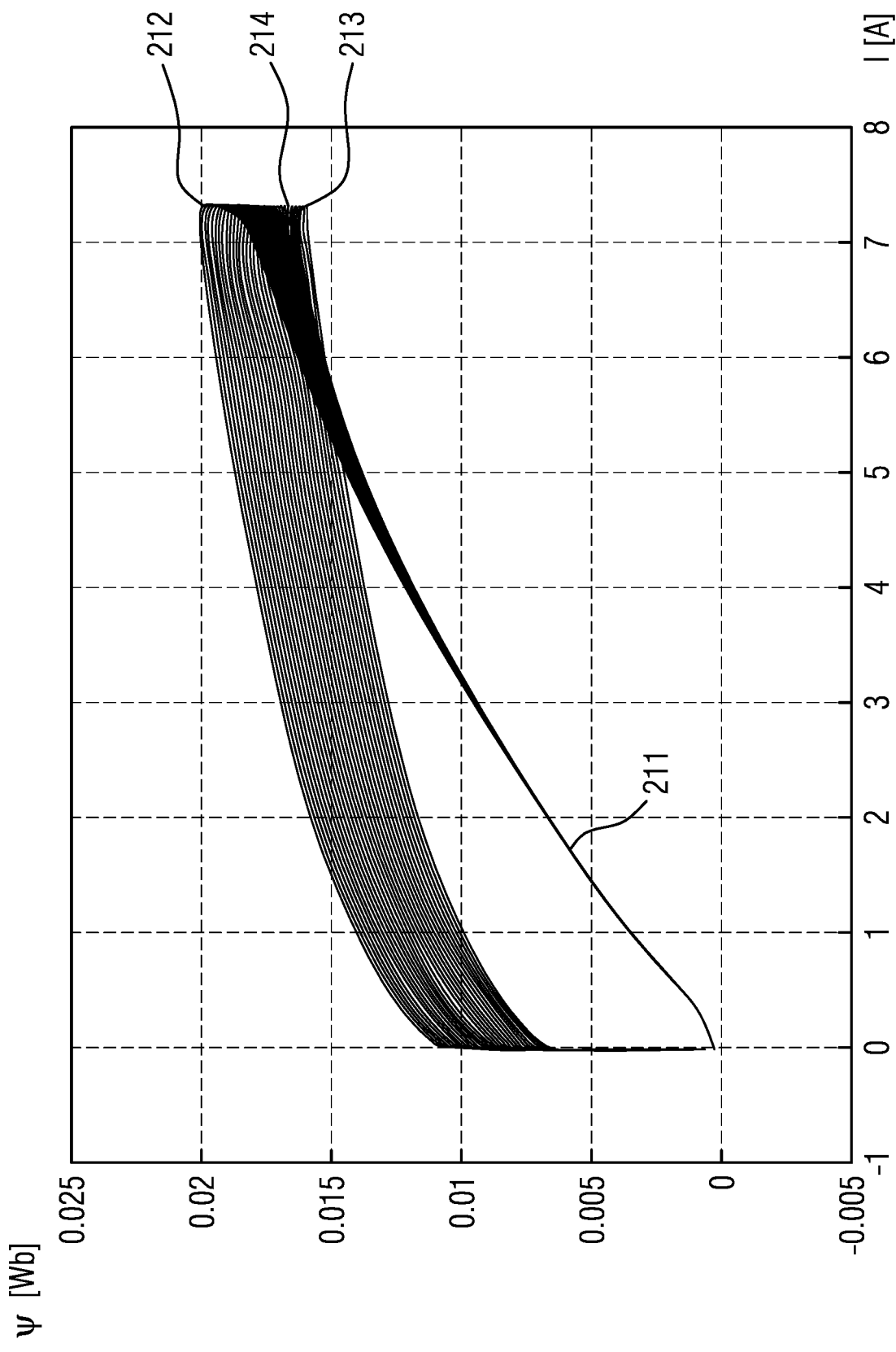
FIG. 2 illustrates a series of calculated relationships between linked flux and current strength in accordance with an exemplary embodiment.

FIG. 2 illustrates a series of such calculated relationships between linked flux $\Psi_k$ and current strength I. To be more specific, FIG. 2 shows 30 (thirty) calculated $\Psi$/I relationships, wherein each relationship corresponds to a hypothetical value $R_{coil,k}$. At the beginning of the voltage pulse (cf. FIG. 1), in other words at the beginning of the increase in current, all the 30 relationships progress essentially in an identical manner. This is demonstrated by the reference numeral 211. If the current strength I achieves a value between approximate 3 A and 4 A, the curves separate, wherein the upper curves 212 have a curve that increases upwards as the current strength increases and the lower curves 213 drop slightly as the current strength increases. These two behaviors are physically not possible (as explained in the introduction). Instead, it can be identified that the relationship(s) 214 in the middle of the bundle comprise in contrast a progression that is expedient in the physical sense, in other words has an almost flat asymptotic progression.

Figure 3:
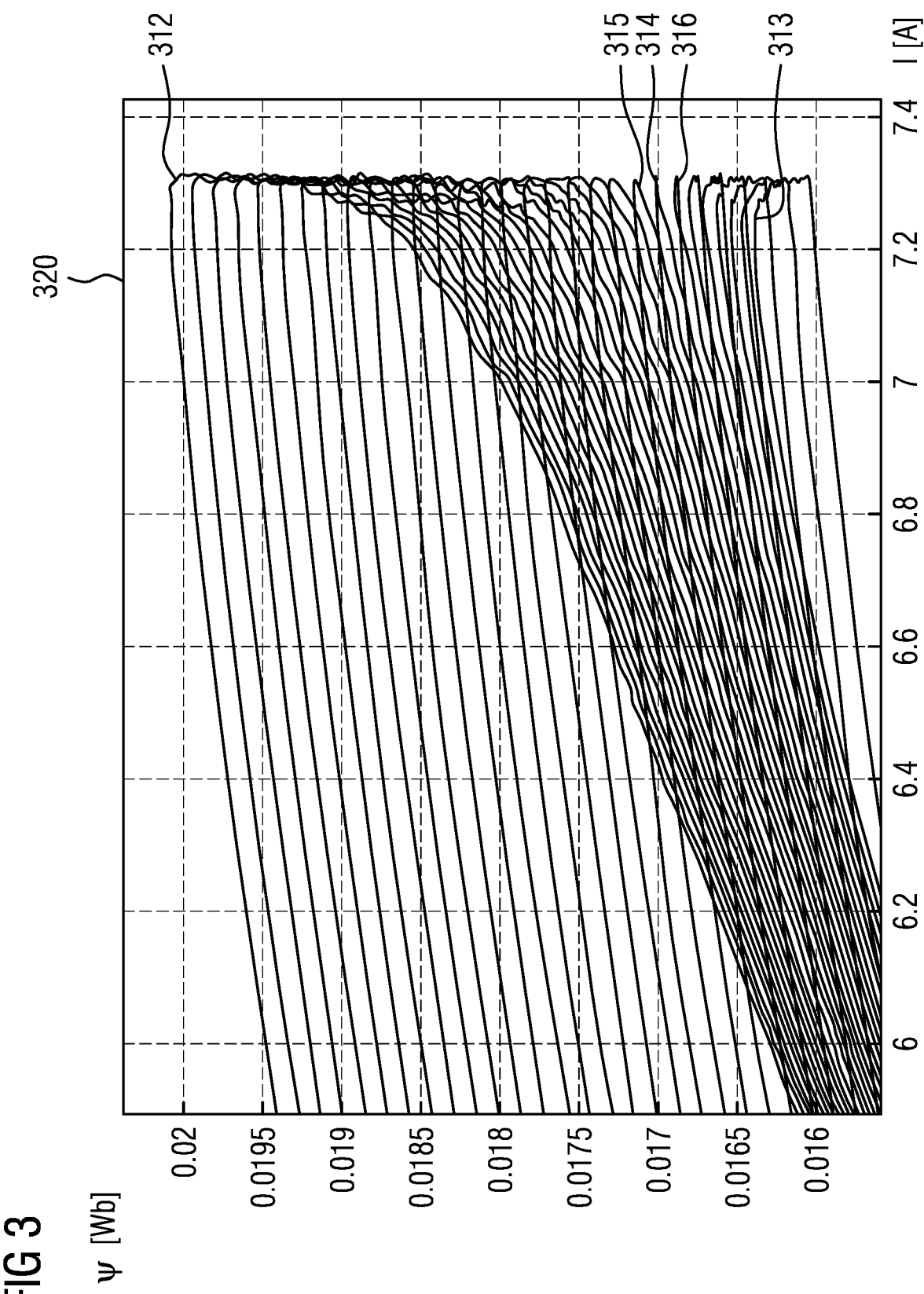
FIG. 3 illustrates an enlarged section from FIG. 2.

FIG. 3 illustrates an enlarged section 320 from FIG. 2 in the region of the maximum current strength, in particular for I between approximately 5.9 A and 7.3 A. It is clearly evident in section 320 that the curve 312 curves upwards in an ever increasing manner, which is physically not commensurate with a saturation. The curve 313 comprises on the other hand a slightly falling value of the linked flux shortly prior to achieving the maximum current strength, which also corresponds in the physical sense to saturation not being present. Consequently, it can be concluded that the hypothetical resistance values that correspond to the curves 312 and 313 deviate from the actual resistance value. The curve 314 comprises as the only one below the 30 curves prior to achieving the maximum current strength a flat asymptotic progression. Even the upper adjacent curve 315 comprises a curve that is slightly increasing upwards, in other words the identical tendency as the curve 312. The lower adjacent curve 316 comprises on the other hand a slightly falling progression, in other words the identical tendency as the curve 313.

In other words, the hypothetical resistance value that has resulted in the curve 314 is to be selected as the determined resistance value.

As far as the technical aspect of this calculation is concerned, this selection can be performed for example by analyzing the first and/or the second derivative for each individual curve. The correct curve is the curve for which the first derivative (in the proximity of the maximum current strength) remains as constant as possible, or to express it differently, the curve for which the value of the second derivative (in the proximity of the maximum current strength) is the closest to zero.

LIST OF REFERENCE NUMERALS

101 Temporal progression of the voltage
102 Temporal progression of the current strength
211 Curves 212 Curves
213 Curves
214 Curves
312 Curve
313 Curve
314 Curve
315 Curve
316 Curve
320 Section

The invention claimed is:

1. A method for determining an electrical resistance value for a fuel injector having a solenoid drive, said method comprising:
    applying a voltage pulse to the solenoid drive of the fuel injector,
    ascertaining a temporal progression of current strength of a current that is flowing through the solenoid drive,
    calculating a series of linked fluxes as a function of the current strength, wherein each linked flux is calculated based on the temporal progression of a voltage across the solenoid drive and the current strength and on a hypothetical resistance value from a series of hypothetical resistance values, each of the hypothetical resistance values being a predetermined resistance value which the fuel injector potentially possesses, and
    selecting one of the hypothetical resistance values as a determined resistance value based on the calculated series of linked fluxes.

2. The method as claimed in claim 1, further comprising creating a curve for each linked flux as a function of the current strength and selecting one of the hypothetical resistance values comprises selecting the one of the hypothetical resistance values based on a predetermined characteristic of the curves of the linked fluxes.

3. The method as claimed in claim 2, wherein the predetermined characteristic of the curve is located in a region of a maximum current strength.

4. The method as claimed in claim 3, wherein the hypothetical resistance value selected is the hypothetical resistance value corresponding to the curve of the flux that demonstrates a smallest change in the region of the maximum current strength, relative to the change in the region of the maximum current strength for the curves of the flux corresponding to other of the hypothetical resistance values, the predetermined characteristic of the curve comprising change to the flux in the region of the maximum current strength.

5. The method as claimed in claim 2, further comprising calculating and evaluating at least one of a first and second derivative of each flux as a function of the current strength, wherein selecting one of the hypothetical resistance values is based on the at least one of the first derivative and the second derivative of each flux as a function of current strength.

6. The method as claimed in claim 1, wherein the voltage pulse is applied to the solenoid drive of the fuel injector by switching on and off a vehicle battery voltage.

7. The method as claimed in claim 1, wherein the series of hypothetical resistance values have a predetermined step size between individual hypothetical resistance values.

8. A method for determining a temperature of a coil of a fuel injector comprising a solenoid drive, said method comprising:
    determining a first resistance value for the coil based on a known reference temperature,
    determining a second resistance value for the coil according to the method as claimed in claim 1, and
    calculating the temperature based on the determined second resistance value, the determined first resistance value and the known reference temperature.

9. An engine control unit for a vehicle, said engine control unit configured to perform the method as claimed in claim 1.

10. An apparatus for determining an electrical resistance value for a fuel injector having a solenoid drive, the apparatus comprising: a processor; and a non-transitory memory device coupled to the processor, the non-transitory memory device storing a computer program which, when executed by the processor, causes the apparatus to perform the method as claimed in claim 1.

11. An engine control unit for controlling an engine including one or more fuel injectors, each fuel injector having a solenoid drive, the engine control unit comprising:
    a processor; and
    a non-transitory memory device coupled to the processor, the non-transitory memory device storing a computer program which, when executed by the processor, executes a method comprising
        applying a voltage pulse to the solenoid drive of the fuel injector,
        ascertaining a temporal progression of current strength of a current that is flowing through the solenoid drive,
        calculating a series of linked fluxes as a function of the current strength, wherein each linked flux is calculated based on the temporal progression of a voltage across the solenoid drive and the current strength and on a hypothetical resistance value from a series of hypothetical resistance values, each of the hypothetical resistance values being a predetermined resistance value which the fuel injector potentially possesses, and
        selecting one of the hypothetical resistance values as a determined resistance value based on the calculated series of linked fluxes.

12. The engine control unit of claim 11, wherein the method executed by the processor further comprises creating a curve for each linked flux as a function of the current strength, and selecting one of the hypothetical resistance values comprises selecting the one of the hypothetical resistance values based on a predetermined characteristic of the curve of the linked flux corresponding to the hypothetical resistance value selected.

13. The engine control unit of claim 12, wherein the predetermined characteristic of the curve is located in a region of a maximum current strength.

14. The engine control unit of claim 13, wherein the hypothetical resistance value selected is the hypothetical resistance value corresponding to the curve of the flux having a smallest change in the region of the maximum current strength, relative to the change in the region of the maximum current strength for the curves of the flux corresponding to other of the hypothetical resistance values, the predetermined characteristic of the curve comprising change to the flux in the region of the maximum current strength.

15. The engine control unit of claim 12, wherein the method executed by the processor further comprises calculating and evaluating at least one of a first and second derivative of each flux as a function of the current strength, wherein selecting one of the hypothetical resistance values is based on the at least one of the first derivative and the second derivative of each flux as a function of current strength.

16. The engine control unit of claim 11, wherein the series of hypothetical resistance values have a predetermined step size between individual hypothetical resistance values in the series.

17. An engine control unit for controlling an engine including one or more fuel injectors, each fuel injector having a solenoid drive, the engine control unit comprising:
- a processor; and
- a non-transitory memory device coupled to the processor, the non-transitory memory device storing a computer program which, when executed by the processor, executes a method comprising
  - applying a voltage pulse to the solenoid drive of the fuel injector,
  - ascertaining a temporal progression of current strength of a current that is flowing through the solenoid drive,
  - calculating a series of linked fluxes as a function of the current strength, wherein each linked flux is calculated based on the temporal progression of a voltage across the solenoid drive and the current strength and on a predetermined resistance value from a series of predetermined resistance values, each of the predetermined resistance values being a predetermined resistance value which the fuel injector potentially possesses, and
  - selecting one of the predetermined resistance values as a determined resistance value based on the calculated series of linked fluxes.

18. The engine control unit of claim 17, wherein the method executed by the processor further comprises creating a curve for each linked flux as a function of the current strength, and selecting one of the predetermined resistance values comprises selecting the one of the predetermined resistance values based on a predetermined characteristic of the curve of the linked flux corresponding to the predetermined resistance value selected.

19. The engine control unit of claim 18, wherein the predetermined characteristic of the curve is located in a region of a maximum current strength.

20. The engine control unit of claim 19, wherein the predetermined resistance value selected is the predetermined resistance value corresponding to the curve of the flux having a smallest change in the region of the maximum current strength, relative to the change in the region of the maximum current strength for the curves of the flux corresponding to other of the predetermined resistance values, the predetermined characteristic of the curve comprising change to the flux in the region of the maximum current strength.

* * * * *